United States Patent
Engelhardt

(10) Patent No.: US 10,490,425 B2
(45) Date of Patent: Nov. 26, 2019

(54) PLASMA SYSTEMS AND METHODS OF PROCESSING USING THEREOF

(71) Applicant: Infineon Technologies AG, Neubiberg (DE)

(72) Inventor: Manfred Engelhardt, Villach-Landskron (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 594 days.

(21) Appl. No.: 14/812,784

(22) Filed: Jul. 29, 2015

(65) Prior Publication Data

US 2017/0032986 A1    Feb. 2, 2017

(51) Int. Cl.
*H01L 21/67* (2006.01)
*H01L 21/3065* (2006.01)
*H01J 37/32* (2006.01)

(52) U.S. Cl.
CPC .... *H01L 21/67069* (2013.01); *H01J 37/3211* (2013.01); *H01J 37/3222* (2013.01); *H01J 37/32284* (2013.01); *H01J 37/32458* (2013.01); *H01L 21/3065* (2013.01); *H01L 21/67115* (2013.01)

(58) Field of Classification Search
USPC .............. 118/723 MW; 156/345.41
See application file for complete search history.

(56) References Cited

U.S. PATENT DOCUMENTS

| | | |
|---|---|---|
| 4,462,863 A | 7/1984 | Nishimatsu et al. |
| 4,518,628 A * | 5/1985 | Biswas ............ C03C 25/104 427/585 |
| 4,745,337 A | 5/1988 | Pichot et al. |
| 4,804,431 A | 2/1989 | Ribner |
| 5,203,959 A | 4/1993 | Hirose et al. |
| 5,954,882 A * | 9/1999 | Wild ............ H01J 37/32192 118/723 ME |
| 6,626,561 B2 * | 9/2003 | Carter ............ F26B 3/28 250/455.11 |
| 6,863,773 B1 | 3/2005 | Emmerich et al. |
| 2001/0008798 A1 * | 7/2001 | Naito ............ C23C 16/511 438/689 |
| 2004/0134431 A1 * | 7/2004 | Sohn ............ C23C 16/274 118/723 MW |
| 2005/0026436 A1 * | 2/2005 | Hogan ............ H01J 37/32431 438/689 |

(Continued)

FOREIGN PATENT DOCUMENTS

| | | |
|---|---|---|
| CN | 1164125 A | 11/1997 |
| CN | 104164658 A | 11/2014 |

(Continued)

OTHER PUBLICATIONS

Donnelly, V. M., et al., "Plasma etching: Yesterday, today, and tomorrow," Vacuum Science Technology, Sep. 5, 2013, pp. 050825-1-050825-48.

*Primary Examiner* — Rakesh K Dhingra
(74) *Attorney, Agent, or Firm* — Slater Matsil, LLP

(57) ABSTRACT

A plasma system includes a plasma chamber comprising a chamber wall with a first focal line and a second focal line disposed within the chamber wall. A first antenna is disposed within the plasma chamber at the first focal line. The chamber wall is configured to focus radiation from the first antenna on to the second focal line.

19 Claims, 14 Drawing Sheets

(56) References Cited

U.S. PATENT DOCUMENTS

| | | |
|---|---|---|
| 2005/0034670 A1 | 2/2005 | Huang et al. |
| 2005/0160987 A1* | 7/2005 | Kasai .................. H05B 6/705 |
| | | 118/723 MW |
| 2010/0218722 A1 | 9/2010 | Vikharev et al. |
| 2011/0171399 A1* | 7/2011 | Brun ................ C04B 35/62868 |
| | | 427/543 |
| 2013/0187544 A1 | 7/2013 | Gesche |

FOREIGN PATENT DOCUMENTS

| | | | |
|---|---|---|---|
| DE | 102012200878 A1 | | 7/2013 |
| JP | 57-43426 | * | 3/1982 |

* cited by examiner

PLASMA SYSTEMS AND METHODS OF PROCESSING USING THEREOF

TECHNICAL FIELD

The present invention relates generally to process equipment, and, in particular embodiments, to a plasma systems and methods for processing devices using the plasma systems.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Success of the semiconductor industry requires delivering higher performance at lower cost. Improving product quality is another challenge in manufacturing semiconductor devices. For example, etching thin films involves the challenge of maintaining a uniform etching rate (both across wafer and within wafer) along with the desired directionality. Similarly, surfaces have to be uniformly cleaned before the deposition of critical layers.

Semiconductor processing systems are ALSO constrained by production cost. Therefore, there is a desire to lower processing time (or increase throughput) and lower down time (or maintenance time), but at the same time improve product quality.

Plasma based processing is commonly used for etching, cleaning, and ashing processes. For example, commonly used plasma systems include barrel etchers, parallel plate systems, high density plasma systems, sputter etching systems, and others.

SUMMARY

In accordance with an embodiment of the present invention, a plasma system comprises a plasma chamber comprising a chamber wall with a first focal line and a second focal line disposed within the chamber wall. A first antenna is disposed within the plasma chamber at the first focal line. The chamber wall is configured to focus radiation from the first antenna on to the second focal line.

In accordance with an embodiment of the present invention, a method of processing a semiconductor wafer includes placing the semiconductor wafer within a plasma chamber. The plasma chamber comprises a chamber wall and a first antenna with a first focal line and a second focal line disposed within the plasma chamber. The first antenna is disposed at the first focal line and the semiconductor wafer is disposed at the second focal line. The first antenna within the plasma chamber is powered to generate electromagnetic radiation. The chamber wall is configured to focus the electromagnetic radiation from the first antenna on to the second focal line.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate a plasma system in accordance with an embodiment of the present invention, wherein FIG. 1A illustrates a cross-sectional view of the plasma system, wherein FIG. 1B illustrates a sectional side view of the plasma system, wherein FIG. 1C illustrates a sectional top view of the plasma system, wherein FIG. 1D illustrates a projection view of the plasma system;

FIGS. 2A-2B illustrate a plasma system comprising an ellipsoidal chamber wall in accordance with an embodiment of the present invention, wherein FIG. 2A illustrates a cross-sectional view of a plasma system in accordance with an embodiment of the present invention, wherein FIG. 2B illustrates a sectional side view of a plasma system in accordance with an embodiment of the present invention;

FIGS. 3A-3B illustrate a plasma system comprising a double elliptical chamber wall in accordance with another embodiment of the present invention, wherein FIG. 3A illustrates a sectional side view of the plasma system, wherein FIG. 3B illustrates a projection view of the plasma system;

DETAILED DESCRIPTION OF ILLUSTRATIVE EMBODIMENTS

Figure 1B:
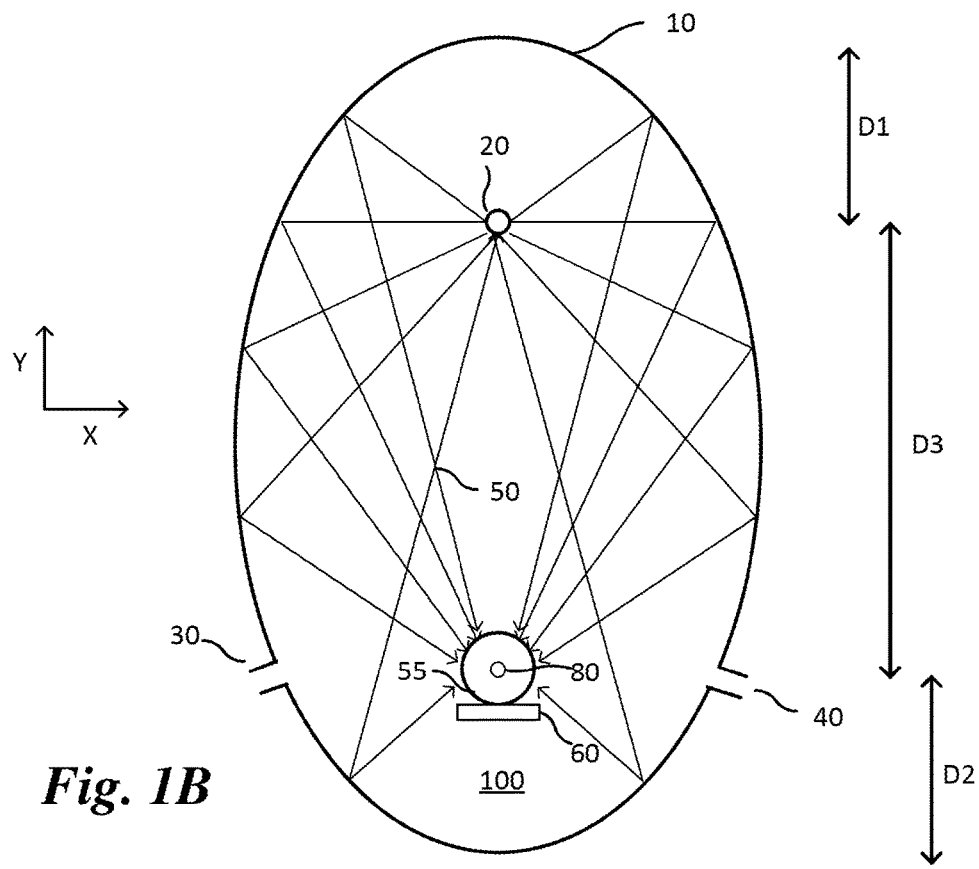

One of the challenges of any plasma system is the tradeoff between etching metrics such as etching rates and throughput, directionality of etching, uniformity of the etching, selectivity, variations (e.g., die-to-die, wafer-to-wafer, lot-to-lot), and other features while minimizing production costs such as costs arising from initial capital costs due to the complexity of the system, wafer throughput, replacement of parts, and equipment down times. Typical plasma processes involve a compromise between the two.

In a typical plasma etching system, an inert gas such as argon is fed into the plasma chamber at low pressures. Plasma may be generated within the plasma chamber by the application of voltage across the plasma chamber, where the power is supplied by radio frequency power or microwave energy, and others. The generated plasma comprises ionized inert gas atoms and neutral reactive chemical species. The ionized inert atoms are attracted or accelerated by the electric field in the chamber while the neutral chemical species are not. The ionized inert atoms travel through the chamber and some of them strike the wafer surface. In contrast, the neutral chemical species diffuse through the plasma chamber and reach the wafer surface. Therefore, the etching rate on the wafer may depend on the number of incident ions, number of chemical species, sticking coefficients of the reactive chemical species, for example.

Increasing the relative content of the ions relative to the chemical species results in more physical etching due to more ions bombarding the surface of the layer to be etched. In contrast, decreasing the relative content of the ions relative to the chemical species results in more chemical etching due to more neutral chemical species reaching the surface of the layer to be etched. Typically, chemical etching results in isotropic etching while physical etching results in anisotropic etching.

Typically, isotropic etching is performed in barrel reactors. In such reactors, the anisotropic nature of the etching is minimized by removing/reducing the physical component of etching. However, chemical etching is a diffusion dominated process and results in lowering of wafer throughput and/or an increase in wafer-to-wafer variation.

In various embodiments of the present invention, etching/ashing/cleaning systems with improved and lower production costs without substantially compromising quality or yield are described using elliptical or ellipsoidal shaped plasma chambers. Various embodiments of the present invention describe redesigning barrel reactors so as to improve the efficiency of plasma excitation and reactant density at the location of the wafers thereby dramatically improving etching rates without degrading variations.

An exemplary embodiment of the present invention will be described using FIG. 1 and various additional embodiments using these concepts will then be described using FIGS. 2-7. Embodiments of fabrication of devices using the plasma system will be described using FIGS. 8-10.

Figure 1A:
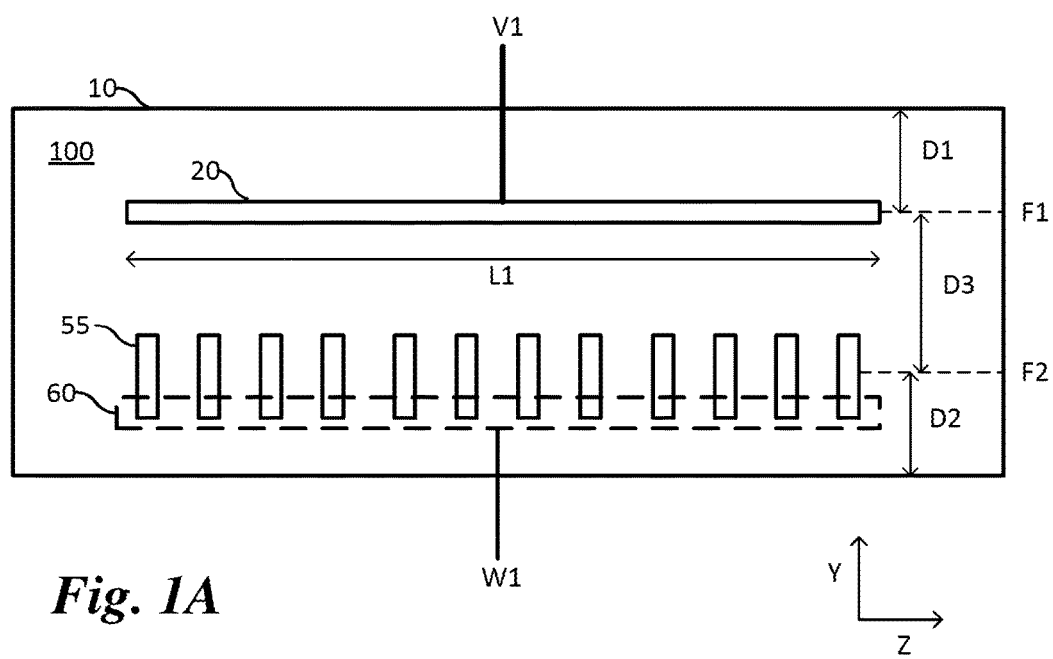
Figure 1C:
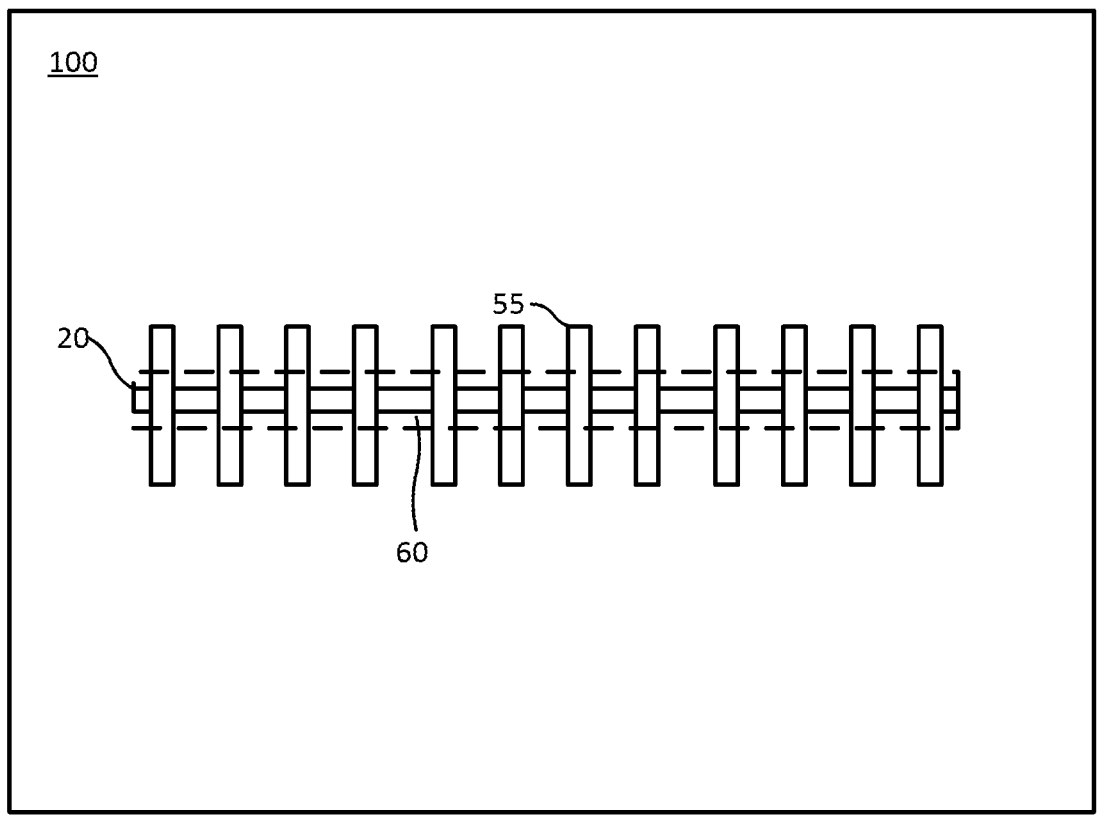
Figure 1C:
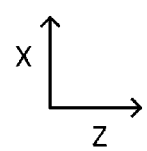
Figure 1D:
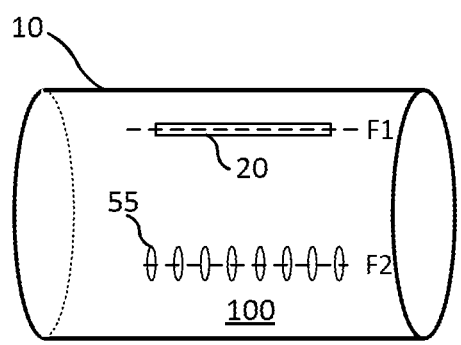

FIG. 1A illustrates a cross-sectional view of a plasma system in accordance with an embodiment of the present invention. FIG. 1B illustrates a sectional side view of a plasma system in accordance with an embodiment of the present invention. FIG. 1C illustrates a sectional top view of a plasma system in accordance with an embodiment of the present invention. FIG. 1D illustrates a projection view of the plasma system.

Referring to FIG. 1A, the plasma system is a microwave plasma system and comprises a plasma chamber 100 having a chamber wall 10. The plasma chamber 100 includes one or more inlets and outlets, for example, an inlet 30 and an outlet 40, for introducing and removing gases used in plasma processing. The inlet 30 and outlet 40 may be controlled by precise flow valves to accurately monitor and control the composition and flow rate of gases into and out of the plasma chamber 100.

The plasma chamber 100 may be evacuated and pressurized with the plasma gases at the appropriate gas pressure. An additional vacuum pump is coupled to the plasma chamber 100 to evacuate the plasma chamber in anticipation of processing the wafers. In various embodiments, the gas pressure may be low, for example, 10 mTorr to 200 mTorr.

The plasma gas may include inert gases such as argon, xenon, nitrogen, helium, as examples. The plasma gas may also include additional reactant gases such as $CF_4$, $O_2$, $XeF_2$, $C_2H_6$, $Cl_2$, $SF_6$, $HBr$, $NF_3$, $CHCl_3$, $CHF_3$, $C_4F_8$, and others. The actual plasma chemistry depends on the required selectivity and materials being etched and desired directionality.

An antenna 20 is disposed within the plasma chamber 100 and is configured to emit electromagnetic radiation for generating ions, i.e., ionizing the plasma gas, within the plasma chamber 100. A typical antenna may be a dipole antenna with the total length of the antenna being odd multiple numbers of half the wavelength ($1/2 \cdot \lambda$, $3/2 \cdot \lambda$, $5/2 \cdot \lambda$ etc.) of the excitation frequency. The antenna includes a metallic conductor which in turn will preferentially not pose a contamination risk to the material exposed to the plasma process. The antenna may also either be coated or surrounded by a protective coating or material liner, respectively. In one embodiment, the antenna 20 may be a rod antenna from whose surface travelling waves are emitted. Accordingly, in such an embodiment, the radiation is maximum is at the axis of the rod. In another embodiment, the antenna 20 may be a resonant antenna such as a monopole or a dipole emitting waves.

As illustrated in FIGS. 1B and 1C, the chamber wall 10 has an elliptical shape from one side but it is cylindrical in other dimensions as also illustrated in the projection view of FIG. 1D. The elliptical cylinder shaped chamber wall 10 is illustrated in FIG. 1D.

In various embodiments, the chamber wall 10 comprises a concave surface such that all microwave radiation reflected at the chamber wall 10 is refocused at a single line within the plasma chamber 100. In various embodiments, the antenna 20 is located at a first focal line F1 while the reflected radiation is refocused at a second focal line F2. In some embodiments, the antenna 20 may be configured to be moved along the first focal line F1 to further minimize variations.

In various embodiments, the chamber wall 10 includes a material coating that is reflective to the electromagnetic radiation emitted by the antenna 20. In various embodiments, the chamber wall 10 comprises a metallic coating for reflecting microwaves. Examples of metals used in the chamber wall 10 include aluminum and others. The chamber wall 10 may include a solid metal layer or may be a wire mesh or grill having holes smaller than about one-tenth of the wavelength of the microwaves. A wire mesh may be used for flexibility in some embodiments.

The plasma is generated within the plasma chamber by the excitation (radiation) produced from the antenna 20. In particular, the antenna 20 may be coupled to a microwave frequency generator, for example, operating at 2.45 GHz, through potential node V1.

Radiation from the antenna 20 is focused around the gas surrounding the wafers 55. As illustrated in FIG. 1B, microwave beams 50 emitted from the antenna 20 are reflected at the chamber wall 10 and focused towards the line 80 generating denser plasma around the wafers 55. The density of the plasma decreases symmetrically away from the line 80 towards the chamber wall 10.

Accordingly, the plasma excitation is maximum around the wafers 55. In other words, although plasma excitation occurs in the entire plasma chamber 100, the plasma is denser in a region immediately around the wafers 55 because of the refocussing of the microwave radiation from the antenna 20 by the chamber wall 10. A higher plasma density around the wafer 55 reduces wafer-to-wafer variations by minimizing depletion of the neutral chemical species in the near field region around the wafers 55. Accordingly, wafer-to-wafer variation is also much lower than conventional barrel reactors because of the proximity and uniformity of the plasma around the wafers 55.

Further, because the plasma is being generated in all directions around the wafers 55, the ions bombard the exposed surfaces from all directions resulting in isotropic etching. Advantageously, chemical etching with radicals can be used to produce isotropic etching.

Additionally, the higher plasma density produces higher throughput than obtainable by other conventional isotropic plasma etching techniques such as barrel reactors.

Accordingly, a batch of wafers 55 may be processed simultaneously within the plasma. The wafers 55 may be mounted on a chuck 60 or other equivalent structure such as a boat to hold a batch of wafers, which may be biased to a different voltage node W1. Advantageously, the plasma density around the second focal line F2 is uniform thereby minimizing variation between adjacent wafers as well as etch uniformly (more isotropic) at each wafer.

In one or more embodiments, the temperature inside the plasma chamber 100 is tightly controlled because of the strong temperature dependence of all the processes occurring within the plasma chamber 100. In some embodiments, the chuck 60 holding the wafers 55 may be heated. Typical temperature within the plasma chamber 100 is about 35° C. to about 60° C., and generally about 25° C. to about 90° C., but may also be 100° C. and even higher.

Referring to FIGS. 1A and 1B, the first nearest distance D1 from the antenna 20 to the chamber wall 10 is substantially equal to the second nearest distance D2 from the wafers 55 to the chamber wall 10. The third nearest distance D3 between the first focal line F1 and the second focal line F2 may be different from the first nearest distance D1 and the second nearest distance D2.

In various embodiments, for a wavelength (WL), the length of the antenna L1 is m×WL/2, while the first nearest distance D1 and the second nearest distance D2 may be (WL/4)×(n+1), the third nearest distance D3 may be (WL/2)×p, wherein m, n, and p may be different or same integers.

In some embodiments, the antenna 20 may be designed to emit radiation at multiple frequencies. For example, in such cases, each wavelength follows the distances described above. In such embodiments, the lengths L1, D1, D2, and D3 as well as wavelengths that can be used are constrained.

In further embodiments, the antenna 20 may include two or more sources. For example, the antenna 20 comprises a first source having a first length emitting at a first wavelength and a second source having a second length emitting at a second wavelength.

Figure 2A:
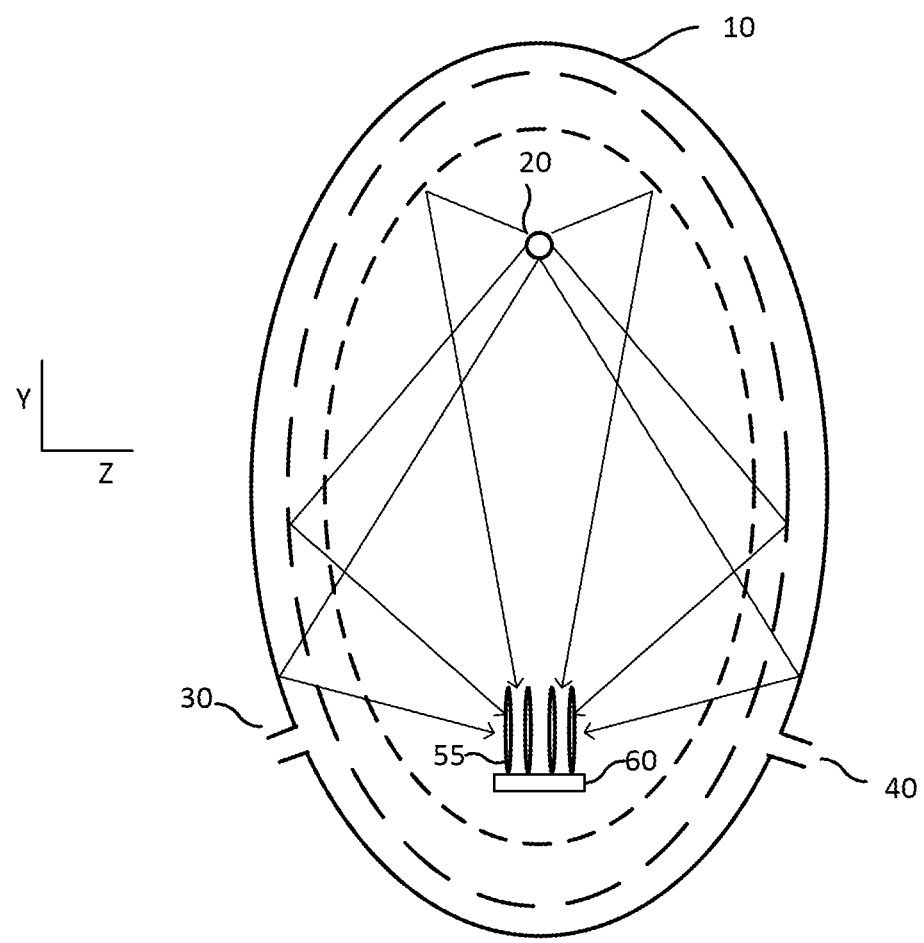
Figure 2B:
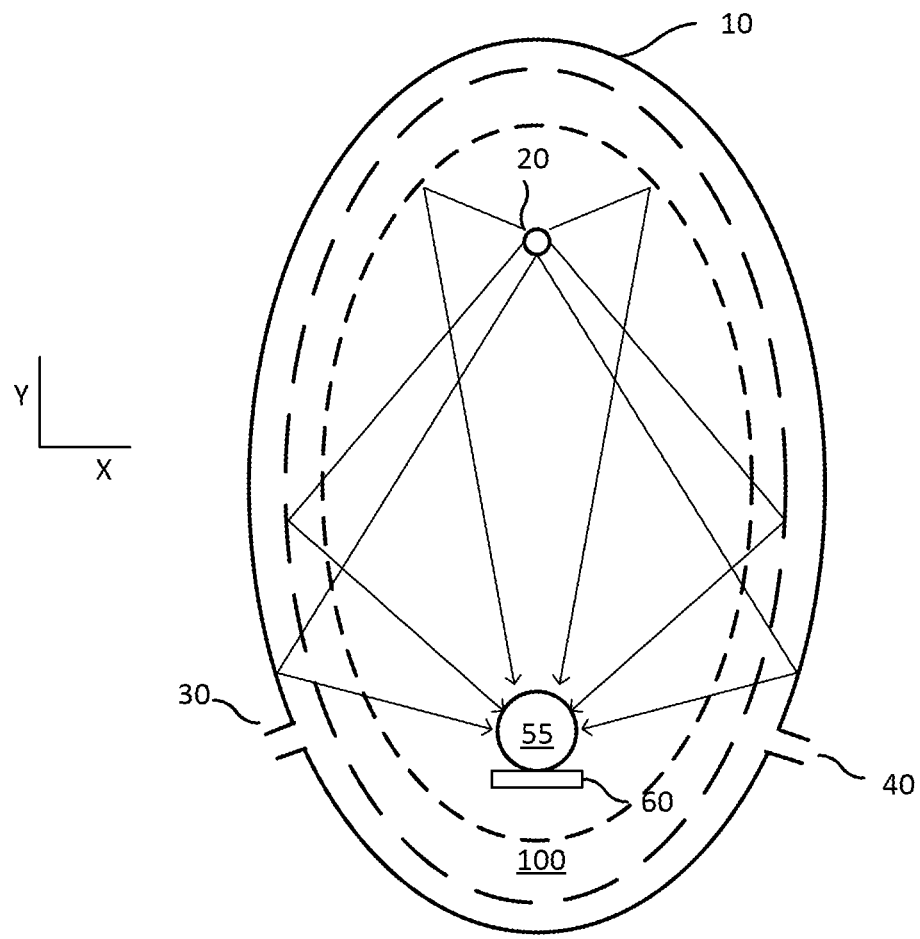

FIG. 2A illustrates a cross-sectional view of a plasma system in accordance with an embodiment of the present invention. FIG. 2B illustrates a sectional side view of a plasma system in accordance with an embodiment of the present invention.

In this embodiment, the chamber wall 10 has an ellipsoidal shape in which the elliptical shape extends in the third dimension. Therefore, as shown in dashed lines, the wall of the plasma chamber 100 slopes inwards in the third dimension. Thus, any beams traveling off axis are also reflected by the chamber wall 10 and refocused onto the second focal line F2 on which the wafers 55 are mounted.

Figure 3A:
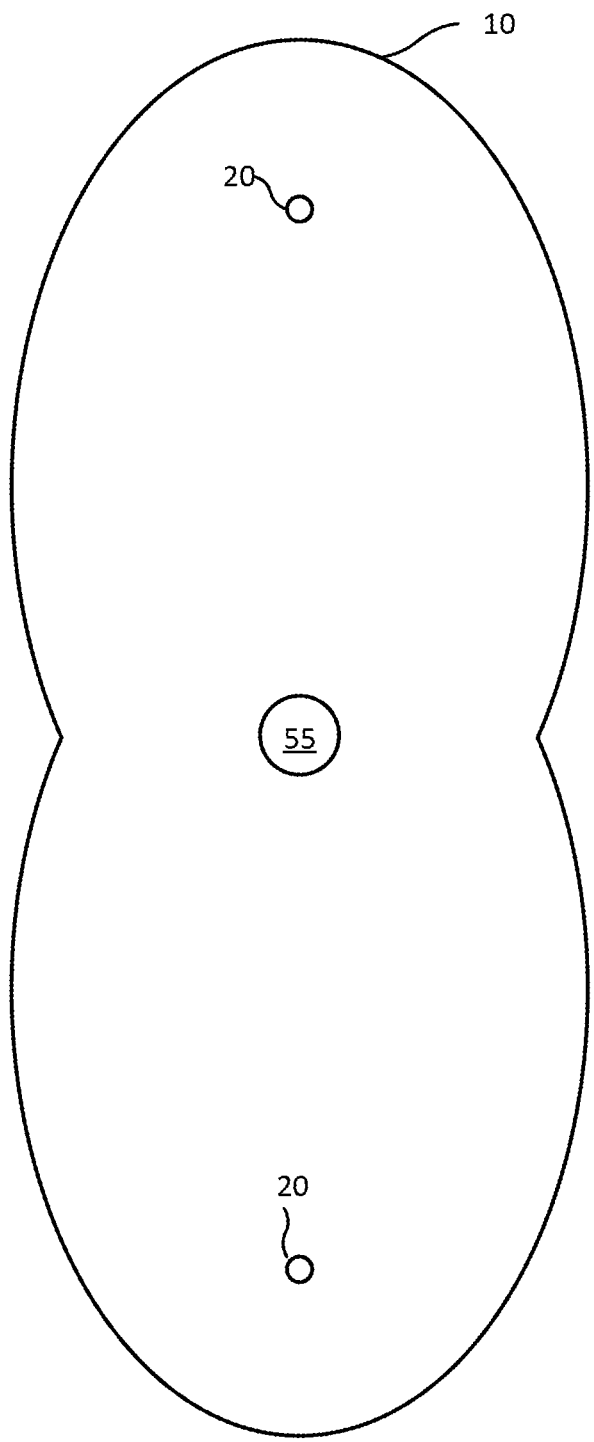
Figure 3B:
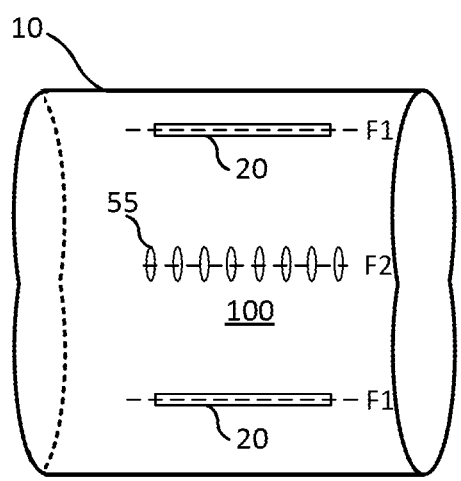

FIG. 3A illustrates a sectional side view of a plasma system in accordance with another embodiment of the present invention. FIG. 3B illustrates a projection view of the plasma system in accordance with another embodiment of the present invention.

In further embodiments, the chamber wall 10 may comprise additional elliptical shapes such as a double ellipse. As an illustration, wafers 55 are located at a central focal point that is a commonly shared focal point between two ellipses. In other words, the plasma chamber wall 10 is made of two elliptical cylindrical sections joined together.

In such embodiments, the chamber wall 10 has three focal points such that two antennas 20 are placed in two of the three focal points. The microwaves emitted from either antennas 20 are refocused at the third focal point at which the wafers 55 are mounted. The two antennas 20 may be shorted in one embodiment. In another embodiment, they may be powered to the same power but may not be phase-locked, i.e., the output from the different antennas 20 may have a phase difference, e.g., of 180 degrees.

Figure 4:
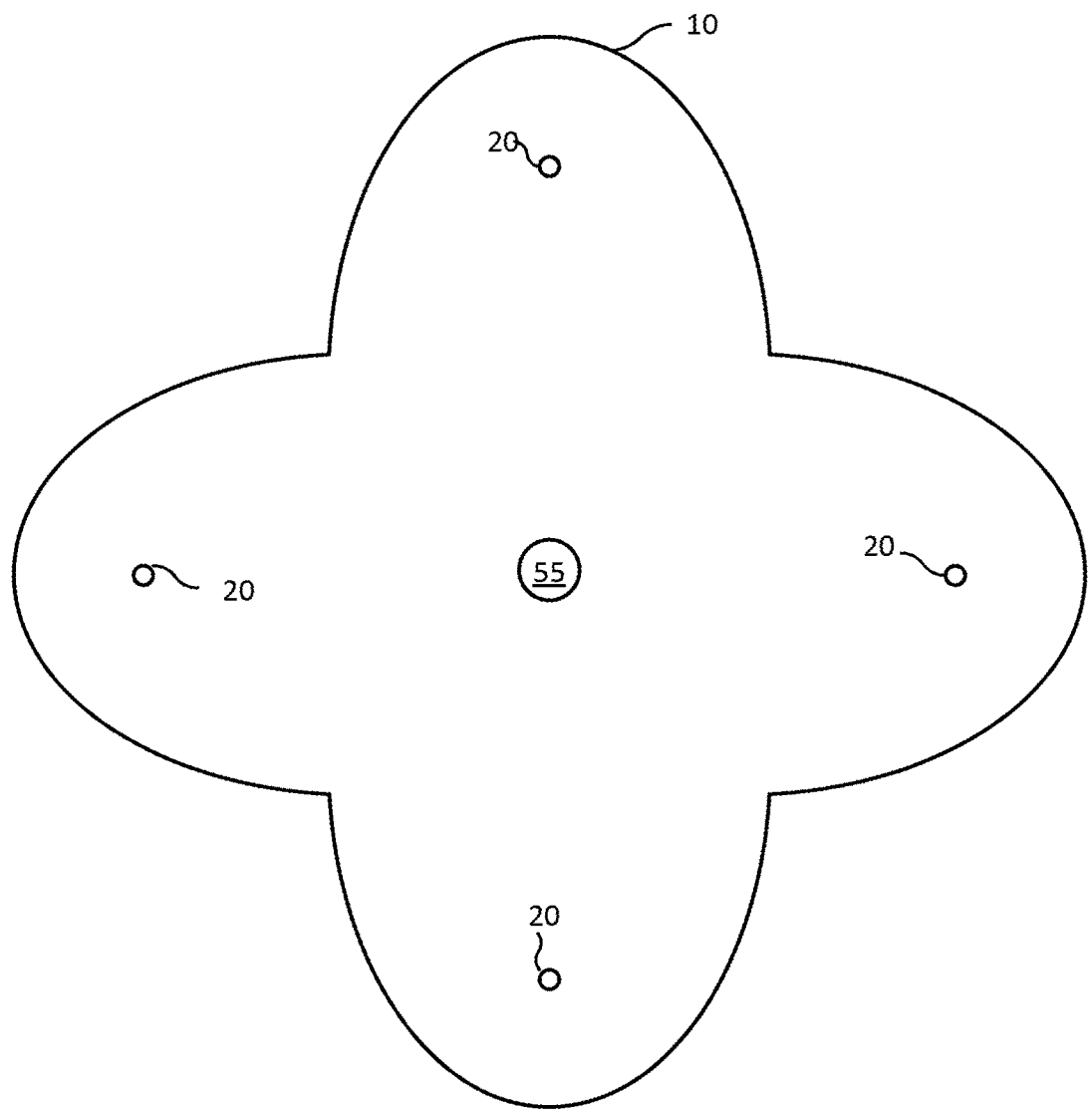
FIG. 4 illustrates a sectional side view of a plasma system comprising a chamber wall with four elliptical cylindrical sections in accordance with a further embodiment of the present invention.

FIG. 4 illustrates a sectional side view of a plasma system in accordance with a further embodiment of the present invention.

In another exemplary embodiment, the chamber wall 10 has five focal points such that four antennas 20 are placed in four of the five focal points. The plasma chamber wall 10 is made of four elliptical cylindrical sections joined together.

The microwaves emitted from either antennas 20 are refocused at the fifth focal point at which the wafers 55 are mounted. As previously described, the antennas 20 are shorted together to minimize variation. In another embodiment, they may be powered to the same power but may not be phase-locked, i.e., the output from the different antennas 20 may have a phase difference, e.g., of 90 degrees.

Figure 5:
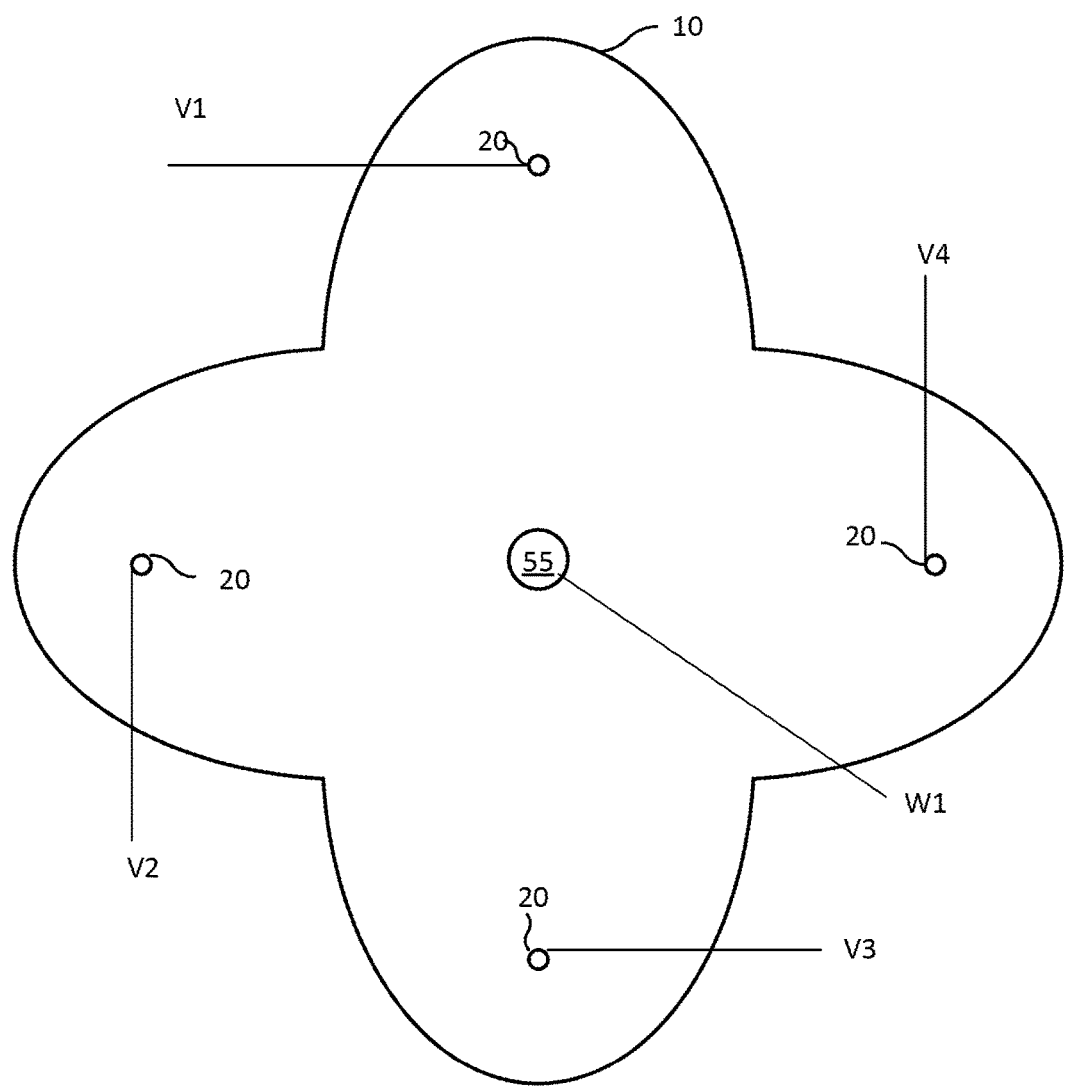
FIG. 5 illustrates a sectional side view of a plasma system in accordance with an embodiment of the present invention.

FIG. 5 illustrates a sectional side view of a plasma system in accordance with an embodiment of the present invention.

The embodiments described in FIGS. 3 and 4 with multiple antennas may also have a further modification as illustrated in FIG. 5. In particular, the different antennas 20 may be coupled to different transmission circuitry and/or potential nodes (V1, V2, V3, V4) that are coupled to different microwave generators. Accordingly, power emitted from the different antennas 20 may be different.

Therefore, in this embodiment, the symmetry of the microwave beams around the wafers 55 may be modified to correct for process variations, variations in chamber wall structure, variations within the plasma chamber, and others.

Figure 6:
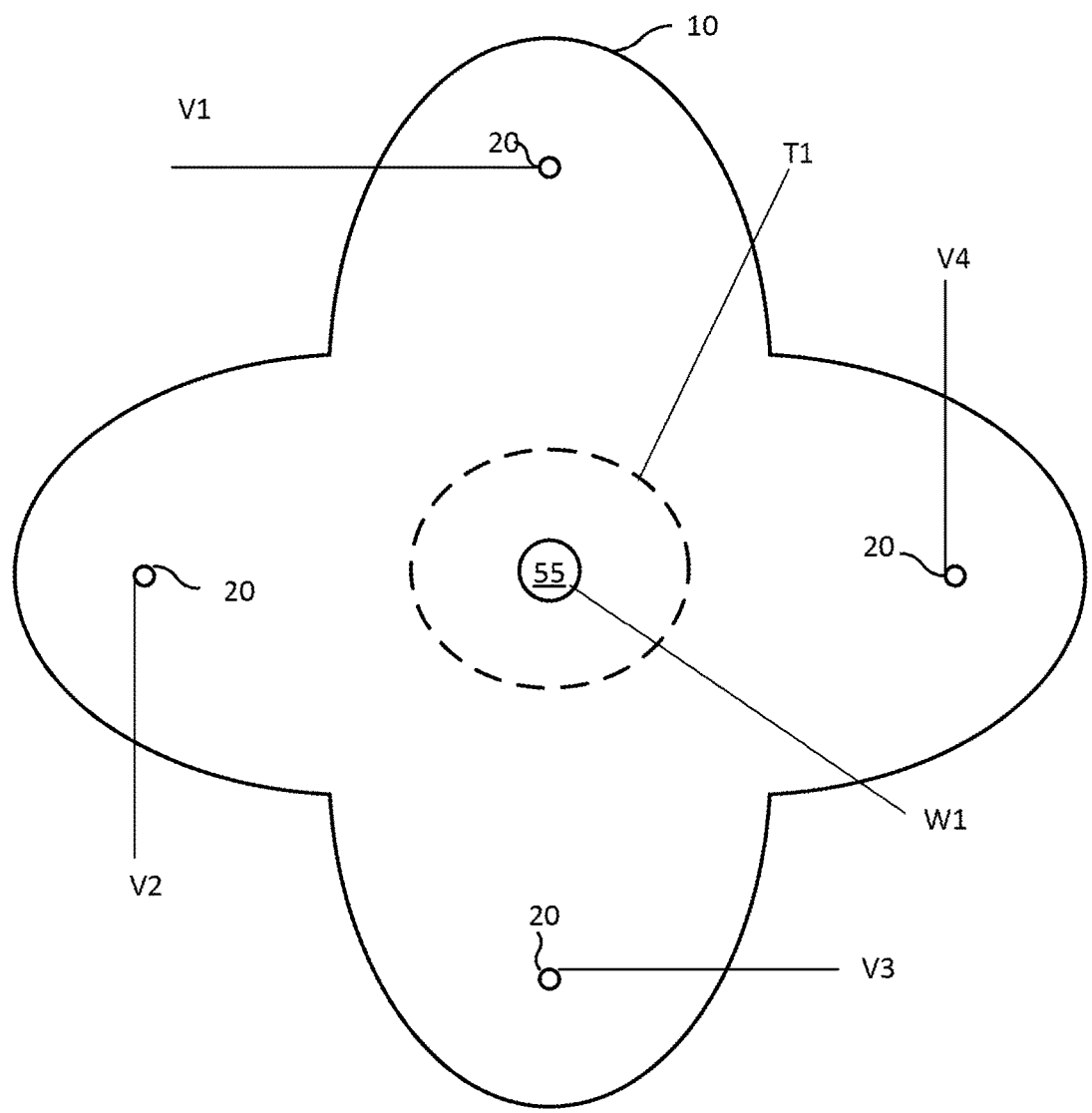
FIG. 6 illustrates a sectional side view of a plasma system in accordance with yet another embodiment of the present invention.

FIG. 6 illustrates a sectional side view of a plasma system in accordance with yet another embodiment of the present invention.

The embodiment of FIG. 6 avoids the plasma from directly contacting the wafers 55. Therefore a sheath T1 is disposed around the wafers 55. The neutral reactive species such as oxygen and fluorine radicals from the plasma diffuse through the sheath T1 and complete the etch process. In contrast, the ions are prevented from impacting the wafers 55 so as to remove or minimize physical etching (ionic bombardment) and therefore any damage to the surface of the wafers 55 and/or sensitive circuits resulting from the ionic bombardment. In this embodiment, the etching is purely chemical and therefore very isotropic and selective. Thus, this embodiment minimizes damage to any sensitive layers on the wafers 55 due to the absence of any direct impact of the charged energetic ions.

Compared to conventional barrel reactors which use similar chemical etching, the uniformity and throughput of the embodiments described herein are much better. This is because conventional barrel reactors suffer from significant wafer to wafer non-uniformity. Due to the long diffusion distances, the concentration of the reactive species between adjacent wafers varies significantly. In particular, the wafer located inside the wafer stack will be etched at a much slower rate than the wafer at the corners of the wafer stack. In contrast, using embodiments of the present invention, the plasma density surrounding each wafer is similar to the plasma density around an adjacent wafer. Therefore, the reactant density at a wafer located inside the wafer stack is similar to the reactant density at a wafer at the corner of the wafer stack. Consequently, much better wafer-to-wafer uniformity is achievable using embodiments of the present invention.

Although FIG. 6 is illustrated as a modification of FIG. 5, this embodiment may be applied to any of the above embodiments described in FIGS. 1-4.

Figure 7:
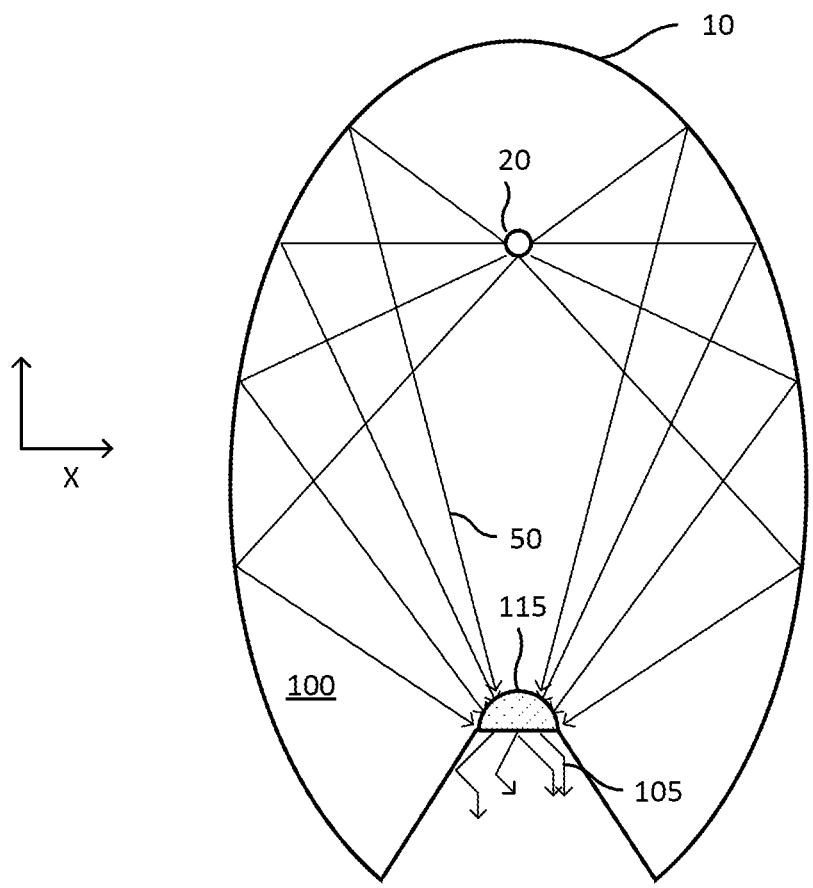
FIG. 7 illustrates a sectional side view of a plasma source of a plasma system in accordance with yet another embodiment of the present invention.

FIG. 7 illustrates a sectional side view of a plasma source of a plasma system in accordance with yet another embodiment of the present invention.

Embodiments of the present invention may also be used in systems with remote plasmas. In other words, the plasma generation process described in various embodiments above may be used to generate plasma, which is then transferred to a different chamber. The refocussing of the microwaves around a single region generates a focused plasma source in various embodiments of the present invention. The reactive chemical species and/or ions from the plasma source may then be used in an etching or depositing step in the adjacent chamber. For example, the chemical species can diffuse into another chamber where it interacts with the wafers. Alternatively, the ionic species may be accelerated downwards and used.

Figure 8A:
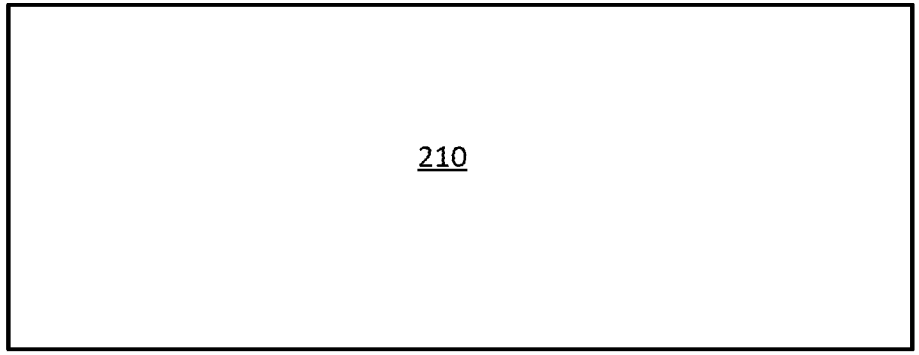
FIGS. 8A-8C illustrates a cross-sectional view of a semiconductor device in various stages of fabrication process with plasma etching in accordance with embodiments of the present invention.
Figure 8B:
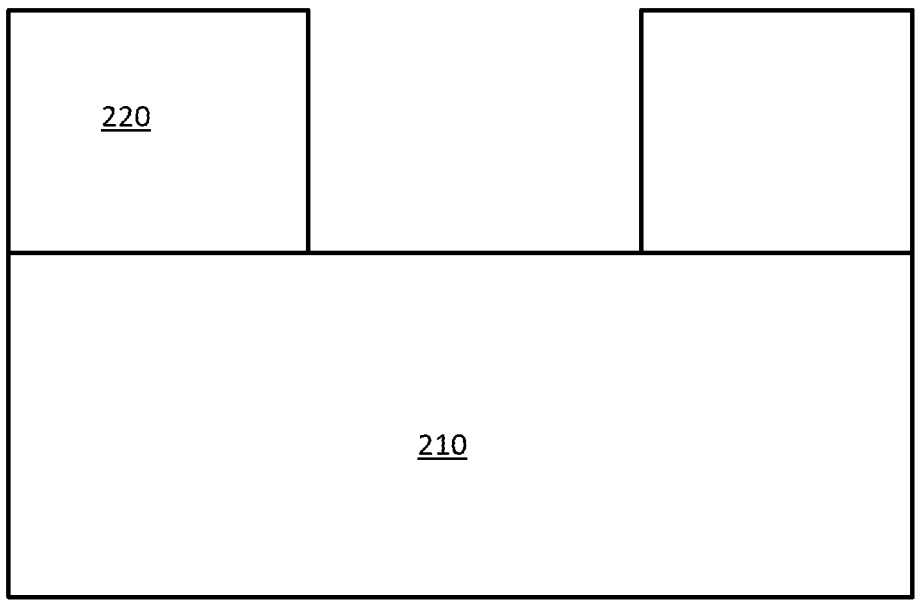
Figure 8C:
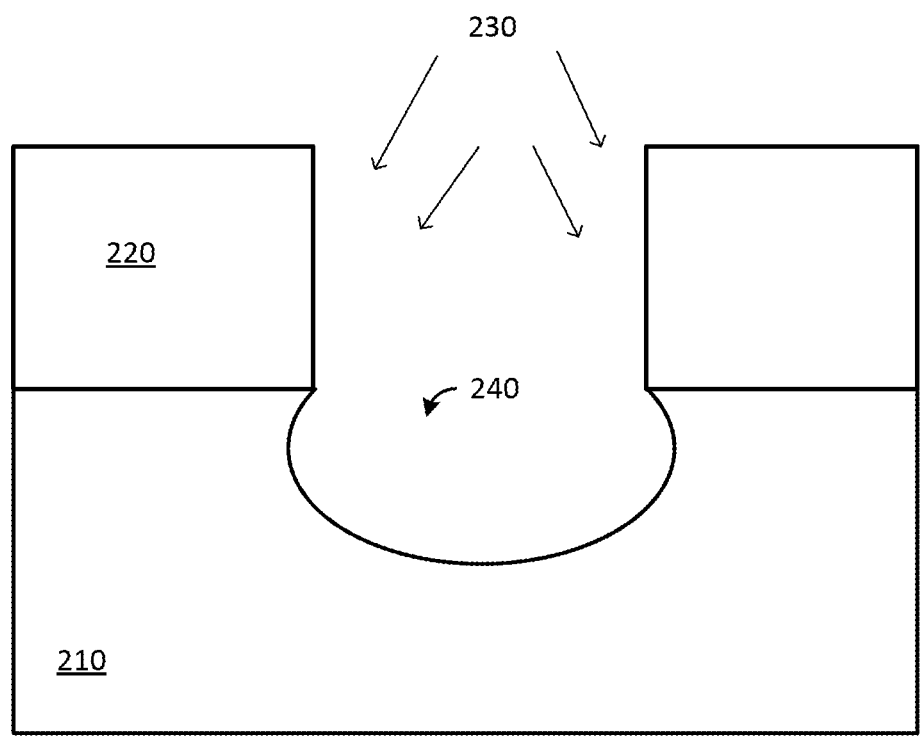

FIGS. 8A-8C illustrates a cross-sectional view of a semiconductor device in various stages of fabrication process with plasma etching in accordance with embodiments of the present invention.

Referring to FIG. 8A, a wafer or a substrate 210 includes a layer to be etched. For example, the substrate 210 may comprise a semiconductor substrate such as a silicon substrate, a germanium substrate or a compound semiconductor substrate such as SiGe, InP, GaAs, or the like. The substrate 210 may comprise a bulk substrate or silicon on insulator (SOI). In some embodiments the substrate 210 may comprise a material layer or a plurality of material layers on the substrate, for example, GaN on silicon, SiC on silicon, InP on silicon, InGaAs on silicon, for example.

The layer to be etched may be a layer of the substrate 210 or may be part of a continuous region of the substrate 210. The layer of the substrate 210 may be a semiconductor material, metallic material, or an insulating material in various embodiments. If the substrate 210 is be patterned, an etch mask 220 is formed over the substrate 210 (FIG. 8B). The etch mask 220 may include a patterned hard mask and/or a patterned photo resist. As next illustrated in FIG. 8C, the substrate 210 is placed within the plasma chamber and exposed to the plasma 230, which is generated as described in various embodiment of the present invention. A hole 240 is formed in the substrate 210 when exposed to the plasma 230. Due to the isotropic nature of the plasma etching process described in various embodiments, the substrate 210 is etched isotropically.

Figure 9A:
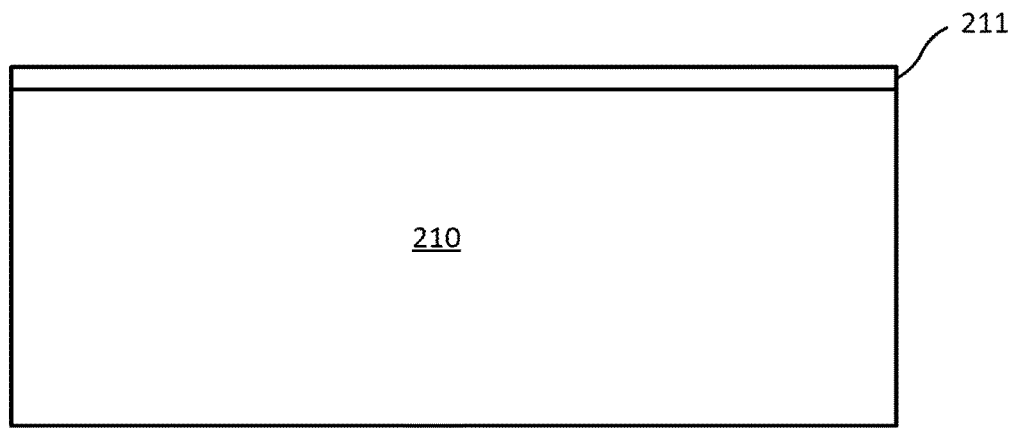
FIGS. 9A-9B illustrates a cross-sectional view of a semiconductor device in various stages of fabrication process with plasma ashing in accordance with embodiments of the present invention.
Figure 9B:
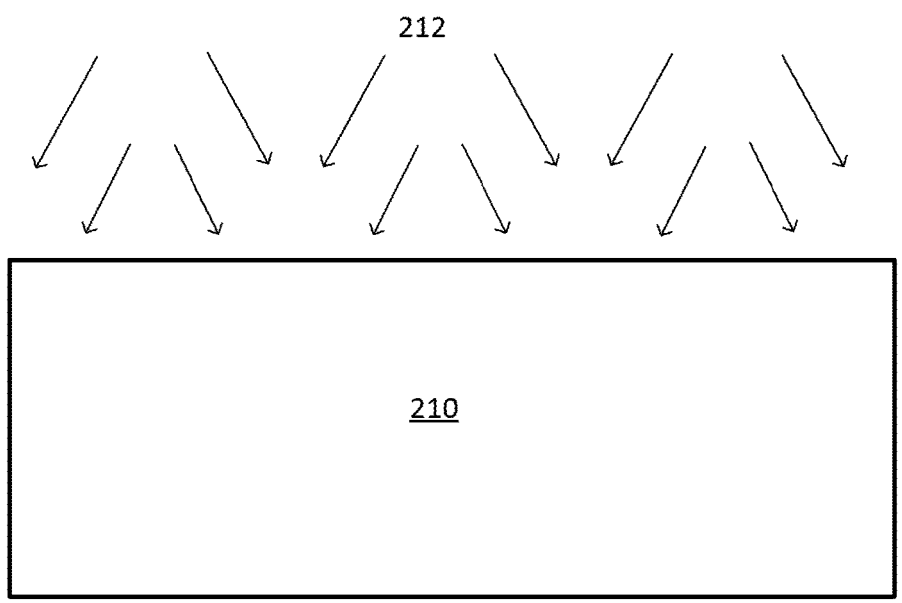

FIGS. 9A-9B illustrates a cross-sectional view of a semiconductor device in various stages of fabrication process with plasma ashing in accordance with embodiments of the present invention.

Plasma ashing process is a surface preparation process in which photoresist and other impurities are removed from the surface of a substrate 210. Plasma ashing processes are typically intended to remove impurities without substantially etching the underlying substrate 210. Therefore, plasma processes with significant physical etching cannot be used for plasma ashing. During plasma ashing, a plasma 212 comprising neutral radicals such as monoatomic oxygen or fluorine is generated in a low pressure plasma chamber as described in various embodiments.

The reactive atoms diffuse towards the substrate 210 comprising a layer 211 to be removed. The layer 211 may be a deposited layer or may be a layer generated during processing. Alternatively, the layer 211 may be a surface layer of impurities formed during processing. The monoatomic reactant species in the plasma form an ash with the layer 211, which is then removed due to the low pressure within the plasma chamber.

In various embodiments, the temperature of the plasma may be controlled to change the efficiency of the plasma process, i.e., from stripping to a descum process.

Figure 10A:
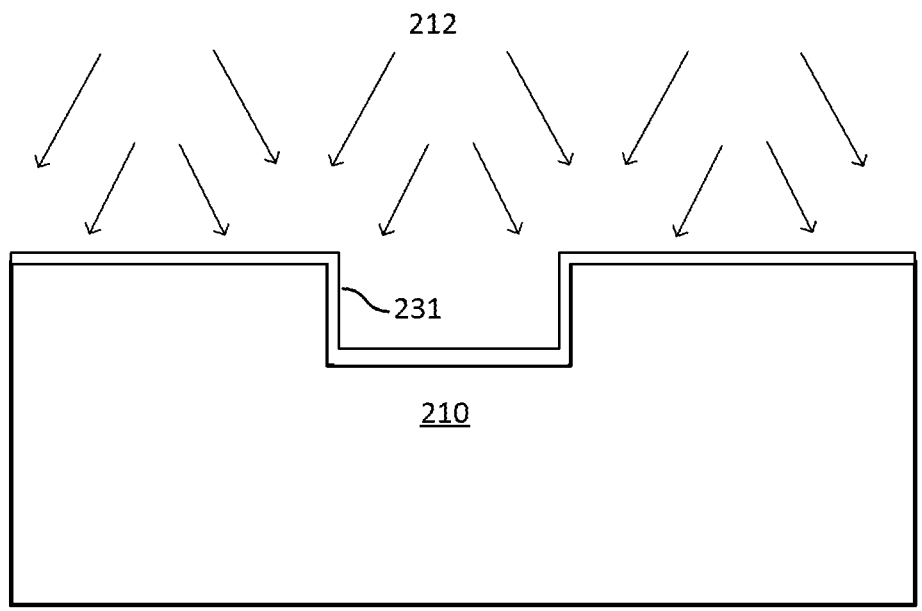
FIGS. 10A-10B illustrates the application of the plasma system for a plasma descumming process in accordance with embodiments of the present invention.
Figure 10B:
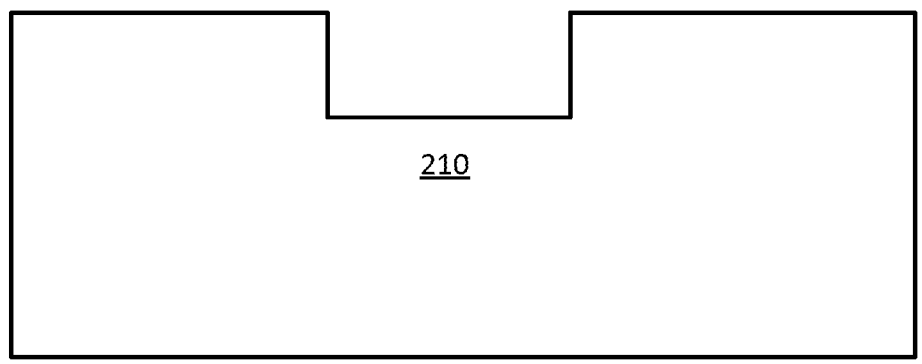

FIGS. 10A-10B illustrates the application of the plasma system for a plasma descumming process in accordance with embodiments of the present invention.

During a plasma descumming process, a small amount of resist layer 221 is removed uniformly. A primary application of this process is a pretreatment step prior to plating or in combination with a lift-off process to avoid problems associated with subsequent processing such as metallization.

The plasma descum process may be performed as a batch process in various embodiments because of the improved uniformity of the plasma. In contrast, conventional plasma descum processes are performed in single wafer units.

In accordance with an embodiment of the present invention, a plasma system comprises a plasma chamber comprising a chamber wall with a first focal line and a second focal line disposed within the chamber wall. A first antenna is disposed within the plasma chamber at the first focal line. The chamber wall is configured to focus radiation from the first antenna on to the second focal line.

Implementations may include one or more of the following features. The plasma system where the chamber wall includes an elliptical shape, an elliptical cylinder, or an ellipsoidal shape. The first antenna may be a source of electromagnetic radiation. The chamber wall may include a reflective material for the electromagnetic radiation. The electromagnetic radiation may include microwaves. The plasma system may further include a chuck for holding a wafer disposed in the plasma chamber. The chuck may be configured to hold the wafer at the second focal line. The plasma system may further include a second antenna disposed at a third focal line of the plasma chamber. The chamber wall may be configured to focus radiation from the second antenna on to the second focal line. The plasma system may further include a second antenna disposed at a third focal line of the plasma chamber and a third antenna disposed within a fourth focal line of the plasma chamber. The chamber wall may be configured to focus radiation from the second antenna and the third antenna on to the second focal line. The plasma system may further include a second antenna disposed within a third focal line of the plasma chamber, a third antenna disposed within a fourth focal line of the plasma chamber and a fourth antenna disposed within a fifth focal line of the plasma chamber. The chamber wall may be configured to focus radiation from the second antenna, the third antenna, and the fourth antenna on to the second focal line. The nearest distance between the chamber wall and the first focal line may be the same as the nearest distance between the chamber wall and the second focal line. The first antenna may be configured to emit radiation at a first wavelength (w). The nearest distance between the chamber wall and the first focal line may be $w \times (n+1)/4$, where a nearest distance between the first focal line and the second focal line may be $p \times w/2$, and where the n and the p are integers. The first antenna may include a rod shaped antenna and may have a length $m \times w/2$, and where m is an integer. The chamber wall may include inlets and outlets for gas.

In accordance with an embodiment of the present invention, a method of processing a semiconductor wafer includes placing the semiconductor wafer within a plasma chamber. The plasma chamber comprises a chamber wall and a first antenna with a first focal line and a second focal line disposed within the plasma chamber. The first antenna is disposed at the first focal line and the semiconductor wafer is disposed at the second focal line. The first antenna within the plasma chamber is powered to generate electromagnetic radiation. The chamber wall is configured to focus the electromagnetic radiation from the first antenna on to the second focal line.

Implementations may include one or more of the following features. The electromagnetic radiation may include microwaves. The method may further include generating plasma in the plasma chamber and exposing the semiconductor wafer to the generated plasma. The method may further include placing a batch of wafers including the semiconductor wafer at the second focal line; generating plasma in the plasma chamber; and exposing the batch of wafers to the generated plasma. The method may further include powering a second antenna at a third focal line within the plasma chamber to generate further electromagnetic radiation. The chamber wall is configured to focus the further electromagnetic radiation from the second antenna on to the second focal line. The method further include powering a second antenna at a third focal line within the plasma chamber to generate first electromagnetic radiation; powering a third antenna at a fourth focal line within the plasma chamber to generate second electromagnetic radiation; powering a fourth antenna at a fifth focal line within the plasma chamber to generate third electromagnetic radiation. The chamber wall may be configured to focus the first, the second, the third electromagnetic radiation from the second, the third, and the fourth antennas on to the second focal line.

Although embodiments of the present invention have been described for microwave plasma systems, they are also applicable for other plasma systems using other frequency radiations. Although embodiments of the present invention have been described for barrel reactors, they may also be applied for any plasma system including plasma deposition systems.

As described in various embodiments, a material that comprises a metal may, for example, be a pure metal, a metal alloy, a metal compound, a semimetal, an intermetallic, and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-7 may be combined with each other in alternative embodiments. It is therefore intended that the appended claims encompass any such modifications or embodiments.

What is claimed is:

1. A plasma system comprising:
a common plasma chamber comprising a chamber wall for confining a plasma, the plasma chamber comprising a first focal line and a second focal line;
a first antenna disposed within the plasma chamber at the first focal line, wherein the chamber wall is configured to focus radiation from the first antenna on to the second focal line; and
a sheath disposed around the second focal line, spaced apart from the chamber wall, and configured to block ions and allow diffusion of oxygen and fluorine radicals,
wherein the plasma chamber wall comprises at least two diametrically opposed elliptical cylindrical sections joined together, and wherein the plasma is configured to be located throughout the entire common plasma chamber including but not limited to tip regions of the two diametrically opposed elliptical cylindrical sections.

2. The plasma system of claim 1, wherein the chamber wall comprises an ellipsoidal shape.

3. The plasma system of claim 1, wherein the first antenna is a source of electromagnetic radiation, and wherein the chamber wall comprises a reflective material for the electromagnetic radiation.

4. The plasma system of claim 3, wherein the electromagnetic radiation comprises microwaves.

5. The plasma system of claim 1, further comprising:
a chuck for holding a wafer disposed in the plasma chamber, wherein the chuck is configured to hold the wafer at the second focal line.

6. The plasma system of claim 1, further comprising a second antenna disposed at a third focal line of the plasma chamber, wherein the chamber wall is configured to focus radiation from the second antenna on to the second focal line.

7. The plasma system of claim 1, further comprising:
a second antenna disposed at a third focal line of the plasma chamber;
a third antenna disposed within a fourth focal line of the plasma chamber, wherein the chamber wall is configured to focus radiation from the second antenna and the third antenna on to the second focal line.

8. The plasma system of claim 1, further comprising:
a second antenna disposed within a third focal line of the plasma chamber;
a third antenna disposed within a fourth focal line of the plasma chamber;
a fourth antenna disposed within a fifth focal line of the plasma chamber, wherein the chamber wall is configured to focus radiation from the second antenna, the third antenna, and the fourth antenna on to the second focal line.

9. The plasma system of claim 1, wherein a nearest distance between the chamber wall and the first focal line is the same as a nearest distance between the chamber wall and the second focal line.

10. The plasma system of claim 1, wherein the first antenna is configured to emit radiation at a first wavelength (W), wherein the nearest distance between the chamber wall and the first focal line is W×(n+1)/4, wherein a nearest distance between the first focal line and the second focal line is p×W/2, and wherein the n and the p are integers.

11. The plasma system of claim 1, wherein the first antenna comprises a rod shaped antenna and has a length m×W/2, and wherein m is an integer.

12. The plasma system of claim 1, wherein the chamber wall comprises inlets and outlets for gas.

13. The plasma system of claim 1, wherein the plasma chamber wall comprises four elliptical cylindrical sections joined together.

14. A plasma system comprising:
a plasma chamber comprising a chamber wall for confining a plasma, the plasma chamber comprising a first focal line and a second focal line;

a chuck for holding a wafer disposed in the plasma chamber, wherein the chuck is configured to hold the wafer at the second focal line;

a first antenna disposed within the plasma chamber at the first focal line, wherein the chamber wall is configured to focus radiation from the first antenna on to the second focal line;

a second antenna disposed within a third focal line of the plasma chamber;

a third antenna disposed within a fourth focal line of the plasma chamber;

a fourth antenna disposed within a fifth focal line of the plasma chamber, wherein the chamber wall is configured to focus radiation from the second antenna, the third antenna, and the fourth antenna on to the second focal line, wherein the first antenna, the second antenna, the third antenna, and the fourth antenna are each coupled to a different transmission circuitry and potential nodes; and a sheath disposed around the second focal line, spaced apart from the chamber wall, and configured to block ions and allow diffusion of oxygen and fluorine radicals, wherein the plasma chamber wall comprises four elliptical cylindrical sections joined together, and wherein the plasma is configured to be located throughout the entire plasma chamber including but not limited to tip regions of the four elliptical cylindrical sections.

15. The plasma system of claim 14, wherein the first antenna, the second antenna, the third antenna, and the fourth antenna are a source of electromagnetic radiation, and wherein the chamber wall comprises a reflective material for the electromagnetic radiation.

16. The plasma system of claim 15, wherein the electromagnetic radiation comprises microwaves.

17. The plasma system of claim 14, wherein a nearest distance between the chamber wall and the first focal line is the same as a nearest distance between the chamber wall and the second focal line.

18. The plasma system of claim 14, wherein the first antenna is configured to emit radiation at a first wavelength (W), wherein the nearest distance between the chamber wall and the first focal line is $W \times (n+1)/4$, wherein a nearest distance between the first focal line and the second focal line is $p \times W/2$, and wherein the n and the p are integers.

19. The plasma system of claim 14, wherein the first antenna comprises a rod shaped antenna and has a length $m \times W/2$, and wherein m is an integer.

* * * * *